United States Patent
Strickland et al.

(10) Patent No.: US 7,237,209 B2
(45) Date of Patent: Jun. 26, 2007

(54) INTEGRATED CIRCUIT DESIGN AND TESTING

(75) Inventors: Keith R. Strickland, Wiltshire (GB); Stephen R. Chadfield, Wiltshire (GB); John B. O'Connell, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 10/819,354

(22) Filed: Apr. 7, 2004

(65) Prior Publication Data

US 2005/0005253 A1    Jan. 6, 2005

(30) Foreign Application Priority Data

Apr. 8, 2003    (GB) .................................. 0308070.2

(51) Int. Cl.
*G06F 17/50*    (2006.01)
(52) U.S. Cl. ............................................ 716/4; 716/12
(58) Field of Classification Search .................... 716/1, 716/4–5, 12; 361/111
See application file for complete search history.

(56) References Cited

U.S. PATENT DOCUMENTS

| 5,796,638 | A    | 8/1998  | Kang et al. |
| 6,265,885 | B1   | 7/2001  | Luo et al. |
| 6,292,343 | B1 * | 9/2001  | Pequignot et al. .......... 361/111 |
| 6,502,229 | B2 * | 12/2002 | Lee et al. ...................... 716/12 |
| 6,725,439 | B1 * | 4/2004  | Homsinger et al. .......... 716/12 |
| 2002/0144213 | A1 | 10/2002 | Ramaswamy et al. |
| 2002/0152447 | A1 | 10/2002 | Venugopal et al. |

* cited by examiner

*Primary Examiner*—Paul Dinh
*Assistant Examiner*—Suresh Memula
(74) *Attorney, Agent, or Firm*—Blakely, Sokoloff, Taylor & Zafman LLP

(57) ABSTRACT

A method of testing an integrated circuit design to determine whether or not the design satisfies an electrostatic discharge protection specification, said circuit design incorporating electrostatic discharge protection routes between top-level nodes of the design. The method comprises defining an electrostatic discharge protection score for each of said electrostatic discharge protection routes, for each top-level node pair, calculating an electrostatic discharge score for every route through the active circuit between the top-level nodes, and identifying active circuit routes between top-level node pairs for which the electrostatic discharge score is less than the electrostatic discharge protection score for the corresponding electrostatic discharge protection route, or lies within a predefined amount of that score.

5 Claims, 2 Drawing Sheets

Cell Name – 'diode'

_US 7,237,209 B2_

INTEGRATED CIRCUIT DESIGN AND TESTING

FIELD OF THE INVENTION

The present invention relates to the design and testing of integrated circuits. More particularly, the invention relates to aspects of the design and testing of integrated circuits relating to electrostatic discharge protection.

BACKGROUND OF THE INVENTION

The demand for fast Time To Market (TTM) and Right First Time (RFT) products in the field of semiconductor integrated circuits (ICs) is great in view of the high costs involved in state-of-the-art IC process technologies. A significant barrier to achieving fast TTM and RFT products is the potentially destructive effects of electrostatic discharge in ICs, particularly as technologies become more complex and device geometries decrease. Hence, in any IC design process a circuit strategy to prevent failure due to electrostatic discharge should be implemented.

There are a number of standards organisations, for example JEDEC (Joint Electron Device Engineering Council), Solid State Technology Association, ESDA (Electrostatic Discharge Association) and MIL (United States Military Standards), that define standards for electrostatic discharge testing models which in turn define particular test waveforms and test methodologies. The most widely accepted electrostatic discharge testing model or waveform is that of the "Human Body Model". IC customers will typically define a required ESD test pass level against a particular model. A typical requirement is for an IC to pass a 2 kV Human Body Model test.

In order to meet these standards, a commonly used approach (e.g. for Mixed Signal RF IC designs) is to provide for each pin-to-pin circuit route (i.e. the route between two pins through the IC) a parallel electrostatic discharge protection route. This is illustrated in FIG. 1 for two input/output (IO) pins of an IC, where the protection route could be for example a pair of back-to-back diodes arranged to breakdown when the pin-to-pin voltage exceeds some predefined voltage (+/−) which is less than the breakdown voltage via the circuit route. It is noted that for each pin-to-pin pair the protection route may not be a direct route. Rather, each pin could be coupled to a different supply voltage rail via its own protection route. The result however would be the same, i.e. breakdown via the protection route when the pin-to-pin voltage exceeds a predefined voltage.

For this electrostatic discharge protection technique to work satisfactorily it is necessary to ensure that the protection routes are sufficiently robust to electrostatic discharge, and that no other electrostatic discharge routes will open prior to the protection routes turning on. However, a combination of ever more complex designs and advanced, high speed technologies with decreasing transistor breakdown voltages, is increasing the likelihood of alternative electrostatic discharge routes within the active circuit, switching on prior to a desired protection route.

If an IC designer can identify potential alternative electrostatic discharge routes in an IC design it may be possible to either re-design the IC or build-in further electrostatic discharge protection to address that particular weakness. This process typically involves a manual inspection of the design, and requires a high level of skill on the part of the designer. The process may be limited to known circuit topologies whose behaviour is well understood.

SUMMARY OF THE INVENTION

According to a first aspect of the present invention there is provided a method of testing an integrated circuit design to determine whether or not the design satisfies an electrostatic discharge protection specification, said circuit design incorporating electrostatic discharge protection routes between top-level nodes of the design, the method comprising:

a) defining an electrostatic discharge protection score for each of said electrostatic discharge protection routes;

b) for each top-level node pair, calculating an electrostatic discharge score for every route through the active circuit between the top-level nodes; and c) identifying active circuit routes between top-level node pairs for which the electrostatic discharge score is less than the electrostatic discharge protection score for the corresponding electrostatic discharge protection route, or lies within a predefined amount of that score.

Embodiments of the present invention offer a novel approach both to ensure RFT design and improve TTM in the area of ESD design. The invention provides a means by which non-ESD specialists can test their designs against pre-defined ESD strategies and by virtue of the nature of ESD protection for IC's, search for potential latent design weaknesses.

In a preferred embodiment of the present invention, said step of calculating an electrostatic discharge score for every route through the circuit between the pins of a top-level node pair comprises, for each route, calculating a score for at least certain of the components present in the route, and summing these scores together. This process may be carried out for all the components in a given route, or may be carried out only for one or more components until the sum exceeds that of the score for the electrostatic discharge protection route of the associated top-level node pair.

Preferably, the method comprises providing a netlist which defines components of the integrated circuit and the interconnectivity of these components. An electrostatic discharge breakdown score is determined for each component for a given technology specification. These scores are then used to calculate the cumulative scores for routes between top-level node pairs.

Preferably, said method comprises an initial step of determining, for each top-level node pair, whether or not an electrostatic discharge protection route is present as specified. If such a route is not present, an error report is generated and the further steps a) to c) are not carried out for that top-level node pair.

A typical top-level node may be a pin of an IC which is used to couple the IC to external components.

DETAILED DESCRIPTION OF CERTAIN EMBODIMENTS

It has been explained above that a serious limitation of existing techniques for identifying weaknesses in electrostatic discharge (ESD) protection is the need for a manual analysis of large complex circuit networks. Ideally, this process should be computerised to both ensure accuracy and to extend the analysis to provide a RFT approach. The process described here is designed for implementation by computer, and relies on an in depth knowledge of the ESD process, particularly in terms of understanding the multitude of breakdown mechanisms possible, and of the ESD testing methodology required. This analysis, utilised with proven success, is based only on DC model parameters and does not require complex transient ESD models of components.

Combining DC model parameters for a given process technology with novel techniques for traversing and simplifying circuit netlists (i.e. lists of components and their connections), it has been possible to develop this technique into an automated program with the following functions:

Confirmation that user defined ESD protection is in place; and

Identification of potential ESD weaknesses in the circuit design.

The functionality of the automated ESD program is based upon the core ability to trace all routes between any two points on a given netlist and concurrently evaluate a quantitative measure for a given route in terms of it's ESD tolerance. The measure of the ESD tolerance is a comparative analysis with that of a built in or desired ESD route. The built in or desired ESD route is checked for it's validity against user defined inputs. In the design environment, ESD components or cells (comprising multiple components) are identified as such within a component description file. The automated ESD program is therefore aware for a given route between top level nodes, if that route comprises only ESD components. For any pair of top-level circuit nodes (typically these top-level nodes are pins which interface the IC to the "outside world") of an IC circuit schematic, the program will determine if the required ESD elements for a given IC process technology are in place, as strategically defined by the user. If these elements are not in place as defined then an error is flagged to the user with details of the particular test route for which the failure occurred. If the elements for a particular test are present and strategically correct, then a score is determined and assigned for this desired ESD route. The program then comparatively analyses all the possible routes between the top-level node pair and the calculated ESD route. This then allows for potentially weak ESD routes within the "active" circuit (i.e. the circuit which provides the functions which the IC is designed to perform) to be identified and flagged to the user.

Figure 2:
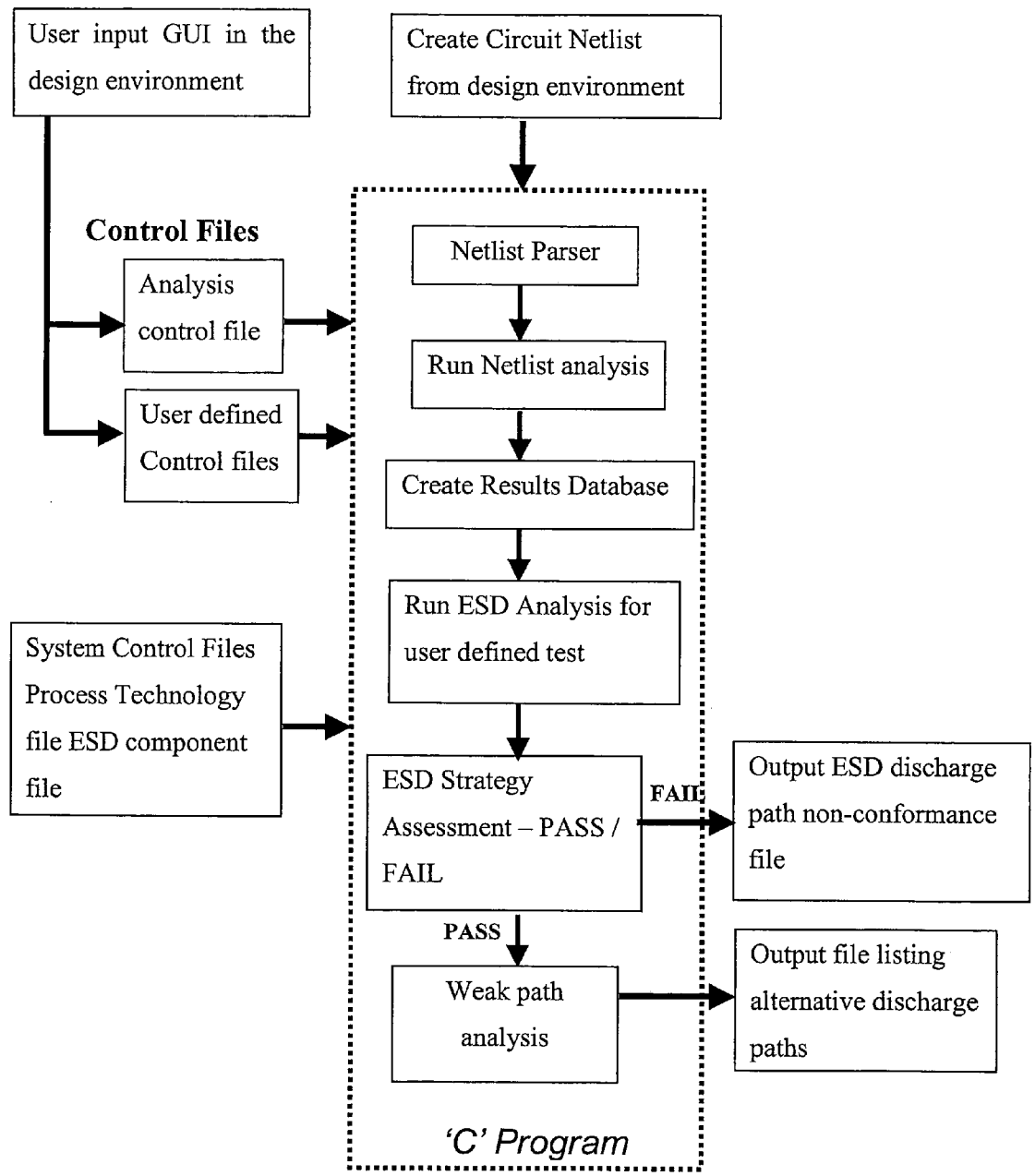
FIG. 2 is a flow diagram illustrating a method of analysing an IC design to identify electrostatic discharge weaknesses.

The general program flow is illustrated in FIG. 2 and described as follows:

a) A standard IC circuit netlist is created from the design environment and input to the ESD program. Such a netlist may be generated following the design of the IC using standard SPICE netlisting tools.

b) User input from the design environment is used to define a number of control files, as follows:

Analysis control file—This file defines the ESD test set-up and identifies the top-level IO pins and top level nets to be tested. The test set-up describes the ESD testing to be 'simulated' for the IC, comprising the pin combinations to be tested.

User-defined control files—Comprises two technology files which the user can utilise to enhance or override the system technology files. Each technology file defines the component model parameters that are subsequently utilised by the program for calculating the ESD tolerance of a given ESD route. One is for the circuit primitives and the other for the ESD sub circuits.

c) The System Control files comprise process specific technology parameters for all process components extracted from component model parameters and are subsequently utilised by the program for calculating the ESD tolerance of a given route between tested pins. The ESD Component file further defines those sub circuits that comprise only ESD components.

d) The Netlist Parser analyses the input netlist and generates a database in the program comprising C data structures.

e) The Netlist Analysis routine is performed on the database produced by the Netlist Parser according to the operations defined in the analysis control file. This analysis is performed using the hierarchy of the input netlist and is controlled concurrently by a global maximum figure of merit defined by the user in the Process Technology file. This technique permits the analysis to be expedited by preventing unnecessary analysis.

f) The Results Database is the collation of all user defined testing results for all routes between any given pin pair under test. This is generated by the Netlist Analysis routine as described above.

g) ESD analysis is now performed on the Results Database for all user-defined pin testing requirements.

h) For each user defined testing between two pin sets the Results Database is first interrogated for compliance with a user defined ESD strategy. Typically the strategy will be that there exists at least one route between the two pins to be tested, which comprises only ESD components. This is defined as a desired ESD route and is assigned a figure of merit based upon the components comprising the route utilising the process control files. Non-compliance to this criterion is reported to the user and for that particular pin test the program performs no further testing.

i) Compliance with the ESD strategy as described above, results in the program then comparing the resulting desired ESD route for a particular test with that of all other possible routes between the two pins under test. Routes that are found to be potentially weak in comparison with the desired ESD route are then reported back to the user.

The ESD weakness detection program relies on the assumption that, for a given netlist route between two nodes through any number and types of components, a numerical value can be assigned which represents the likelihood that the route will conduct during an ESD event. The total value or score for a given route is simply the sum of the scores of all the components that comprise the route. The program is able to assign a score to an intended ESD route designed for the specific purpose of providing ESD protection to the device. A score for any given netlist route is therefore comparable with that calculated for the intended ESD route and hence predictions can be made as to whether the netlist route is a potential weakness for the device.

Figure 1:
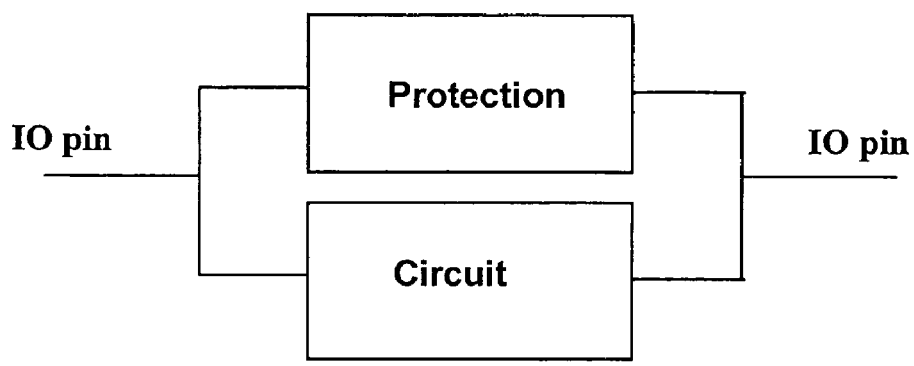
FIG. 1 illustrates schematically a known electrostatic discharge protection mechanism for an IC.
Figure 3:
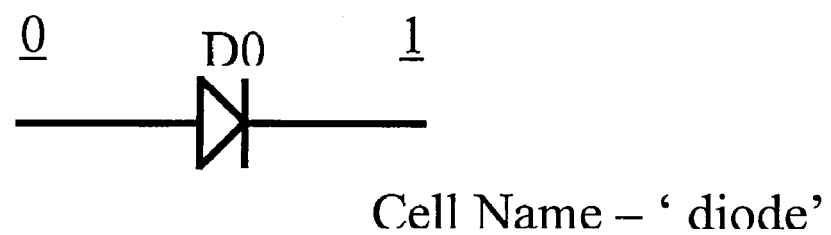
FIG. 3 illustrates an example of a cell primitive which may provide one link in a chain of components extending between two pins of an IC.

Consider a simple diode component primitive as illustrated in FIG. 3. Such a component would be expected to have a low score when forward biased and a high score when reversed biased. With the program technology file language, this scoring is captured as follows;

diode (0,1) 0.7
diode (1,0) 20.0

This states that for instances of cell diode, when pin 0 is at a higher potential than pin 1 the component scores 0.7, and when the reverse is true the component scores 20.0.

This analysis described here can be extended to work at the sub-circuit level, with a score table being generated for all routes between all top-level nodes of the sub-circuit. The analysis caters for nested sub-circuits and is able to take account of multiple resistor components in series and parallel.

ESD components are uniquely identified as a sub-circuit whose score is defined in the ESD sub-circuit technology file. An ESD route is then defined as one which only passes through ESD components and whose score is less than that defined by a global maximum. The global maximum is defined by the user and will be specific to the technology and ESD strategy utilised for a particular design. Put another way, given a particular silicon technology and ESD methodology we can ascertain a maximum score that one would expect for any ESD protection route. We can then define a "global maximum" figure that can be used in conjunction with ESD component identification to check that a design on the given technology has the required ESD protection routes designed in. So, we check that a design has all the required ESD protection routes for all the various node to node tests, and then check to see that none of these built-in protection routes are compromised by weak routes within the actual IC functional circuitry itself.

It will be appreciated by the person of skill in the art that various modifications may be made to the above described embodiments without departing from the scope of the present invention. For example, the following functions may be incorporated into the program:

1. The extraction of parasitic effects from IC layout topology and routing;
2. The back annotation of data from a results file to the design environment; and
3. Utilisation of user defined ESD strategy to have post-analysis corrective solutions automatically generated by the program.

The invention claimed is:

1. A method of testing an integrated circuit design to determine whether or not the design satisfies an electrostatic discharge protection specification, said circuit design comprising an active circuit and incorporating electrostatic discharge protection routes between top-level nodes of the design, the method comprising:
   a) defining an electrostatic discharge protection score for each of said electrostatic discharge protection routes, said score representing said electrostatic discharge protection route will conduct during an electrostatic discharge event;
   b) for each pair of said top-level nodes, calculating an electrostatic discharge score for every route through the active circuit between the top-level nodes, said score representing said route through said active circuit will conduct during said electrostatic discharge event; and
   c) identifying route in said active circuit between said pairs of top-level nodes for which the electrostatic discharge score is less than the electrostatic discharge protection score for the corresponding electrostatic discharge protection route, or lies within a predefined amount of that score.

2. A method according to claim 1, wherein said step of calculating an electrostatic discharge score for every route through the circuit between the pins of a pair of said top-level nodes comprises, for each route, calculating a score for at least certain of components present in the route representing the component will conduct during an electrostatic discharge event, and summing these scores together.

3. A method according to claim 1, the method comprising providing a netlist which defines components of the integrated circuit and the interconnectivity of these circuits, and calculating said scores using the netlist.

4. A method according to claim 1, wherein said method comprises an initial step of determining, for each top-level node pair, whether or not an electrostatic discharge protection route is present as specified, and, if such a route is not present, generating an error report.

5. A method according to claim 1, wherein at least one of said top-level nodes is a pin of an IC which is used to couple the IC to external components.

* * * * *